US006822251B1

(12) United States Patent
Arenberg et al.

(10) Patent No.: US 6,822,251 B1
(45) Date of Patent: Nov. 23, 2004

(54) MONOLITHIC SILICON EUV COLLECTOR

(75) Inventors: Jonathan W. Arenberg, Santa Monica, CA (US); Frank R. Hassell, Torrance, CA (US)

(73) Assignee: University of Central Florida Research Foundation, Orlando, FL (US)

(*) Notice: Subject to any disclaimer, the term of this patent is extended or adjusted under 35 U.S.C. 154(b) by 0 days.

(21) Appl. No.: 10/705,410

(22) Filed: Nov. 10, 2003

(51) Int. Cl.[7] .............................. G01J 1/00; G21G 4/00
(52) U.S. Cl. .................... 250/504 R; 378/119; 250/365
(58) Field of Search ............................ 250/504 R, 365, 250/492.1, 492.2; 378/34, 119; 355/53, 30, 67

(56) References Cited

U.S. PATENT DOCUMENTS

| 5,209,291 | A | * | 5/1993 | Taylor ......................... 165/168 |
| 6,285,743 | B1 | * | 9/2001 | Kondo et al. ............... 378/119 |
| 6,738,452 | B2 | * | 5/2004 | McGregor et al. .......... 378/119 |
| 2002/0141536 | A1 | * | 10/2002 | Richardson .................. 378/119 |
| 2004/0086080 | A1 | * | 5/2004 | Orsini et al. ................ 378/119 |

* cited by examiner

Primary Examiner—Nikita Wells
Assistant Examiner—Johnnie L Smith, II
(74) Attorney, Agent, or Firm—John A. Miller; Warn, Hoffmann, Miller & LaLone, P.C.

(57) ABSTRACT

A collector optic assembly for a EUV radiation source. The collector optic assembly includes an elliptical meniscus having a reflective Si/Mo coating for collecting and reflecting EUV radiation generated by the source. The meniscus is machined from a single piece of silicon. The collector optic assembly further includes a heat exchanger that includes cooling channels through which flows a liquid coolant. The heat exchanger is fabricated from a plurality of machined silicon sections fused together by a glass frit bonding process. The meniscus is fused to a front side of the heat exchanger by a glass frit bonding process. A liquid coolant inlet manifold and a liquid coolant outlet manifold are also each machined from a single silicon block and are mounted to a back side of the heat exchanger.

20 Claims, 4 Drawing Sheets

MONOLITHIC SILICON EUV COLLECTOR

BACKGROUND OF THE INVENTION

1. Field of the Invention

This invention relates generally to a collector optic for a light source and, more particularly, to a collector optic for a laser plasma extreme ultraviolet (EUV) radiation source, where the collector optic includes an assembly of silicon parts fused together by a glass frit bonding process and where the collector optic includes a liquid cooling system.

2. Discussion of the Related Art

Microelectronic integrated circuits are typically patterned on a substrate by a photolithography process, well known to those skilled in the art, where the circuit elements are defined by a light beam propagating through a mask. As the state of the art of the photolithography process and integrated circuit architecture becomes more developed, the circuit elements become smaller and more closely spaced together. As the circuit elements become smaller, it is necessary to employ photolithography light sources that generate light beams having shorter wavelengths and higher frequencies. In other words, the resolution of the photolithography process increases as the wavelength of the light source decreases to allow smaller integrated circuit elements to be defined. The current trend for photolithography light sources is to develop a system that generates light in the extreme ultraviolet (EUV) or soft X-ray wavelengths.

Various devices are the known in the art to generate EUV radiation. One of the most popular EUV radiation sources is a laser-plasma, gas condensation source that uses a gas, typically Xenon, as a laser plasma target material. Other gases, such as Argon and Krypton, and combinations of gases, are also known for the laser target material. In the known EUV radiation sources based on laser produced plasmas (LPP), the gas is typically cryogenically cooled in a nozzle to a liquid state, and then forced through an orifice or other nozzle opening into a vacuum process chamber as a continuous liquid stream or filament. The liquid target material rapidly freezes in the vacuum environment to become a frozen target stream. Cryogenically cooled target materials, which are gases at room temperature, are required because they do not condense on the source optics, and because they produce minimal by-products that have to be evacuated by the process chamber. In some designs, the nozzle is agitated so that the target material is emitted from the nozzle as a stream of liquid droplets having a certain diameter (30–100 µm) and a predetermined droplet spacing.

The target stream is radiated by high-power laser beam pulses, typically from an Nd:YAG laser, that heat the target material to produce a high temperature plasma which emits the EUV radiation. The frequency of the laser beam pulses is application specific and depends on a variety of factors. The laser beam pulses must have a certain intensity at the target area in order to provide enough energy to generate the plasma. Typical pulse durations are 5–30 ns, and a typical pulse intensity is in the range of $5 \times 10^{10}$–$5 \times 10^{12}$ W/cm².

FIG. 1 is a plan view of an EUV radiation source 10 of the type discussed above including a nozzle 12 having a target material storage chamber 14 that stores a suitable target material, such as Xenon, under pressure. A heat exchanger or condenser is provided in the chamber 14 that cryogenically cools the target material to a liquid state. The liquid target material is forced through a narrowed throat portion or capillary tube 16 of the nozzle 12 to be emitted under pressure as a filament or stream 18 into a vacuum process chamber 26 towards a target area 20. The liquid target material will quickly freeze in the vacuum environment to form a solid filament of the target material as it propagates towards the target area 20. The vacuum environment in combination with the vapor pressure of the target material will cause the frozen target material to eventually break up into frozen target fragments depending on the distance that the stream 18 travels and other factors.

A laser beam 22 from a laser source 24 is directed towards the target area 20 in the process chamber 26 to vaporize the target material. The heat from the laser beam 22 causes the target material to generate a plasma 30 that radiates EUV radiation 32. The EUV radiation 32 is collected by collector optics 34 and is directed to the photolithography apparatus (not shown), or other system using the EUV radiation 32. The collector optics 34 is an ellipsoidal reflector dish, where the target area 20 is at the near focal point of the optics 34, and where the aperture for the photolithography apparatus is positioned at the far focal point of the collector optics 34. In this design, the laser beam 22 propagates through an opening 36 in the collector optics 34, as shown.

The collector optics 34 is designed to have the desired collection efficiency, have a minimum angle of incidence of the EUV radiation 32 on the collector optics 34, and have the proper maximum angle of the radiation 32 at the far focal point so that as much of the EUV radiation 32 is collected by the photolithography apparatus.

It is desirable that as much of the EUV radiation 32 as possible be collected to improve source efficiency. For example, the higher the intensity of the EUV radiation 32 for a particular photolithography process, the less time is necessary to properly expose the various photoresists and the like that are being patterned. By decreasing the exposure time, more circuits can be fabricated, thus increasing the throughput efficiency and decreasing the cost. Further, by providing more useable EUV radiation from the collector optics 34, the intensity of the laser beam 22 can be lower, also conserving system resources.

Optimizing the reflectance of the reflective surface of the collector optics 34 is one way in which the amount of the EUV radiation 32 that is collected can be increased. Typically, the reflective surface of the collector optics 34 is coated with a reflective coating to enhance its reflectance. However, it is also important that the coating material not contaminate source components in response to the high energy ions generated by the plasma 30 that may impinge the reflective surface and release coating material. One such coating that provides the desired characteristics is a silicon/molybdenum (Si/Mo) multilayer coating. However, the best Si/Mo multilayer coating on the collector optics 34 only reflects about 70% of the EUV radiation 32 impinging thereon, even at its theoretical maximum performance.

The incident radiation 32 generated by the LPP that is not reflected by the collector optics 34 is absorbed by the collector optics 34. The absorbed radiation heats the collector optics 34 to such a degree that the Si/Mo multilayer coating on the optics will be damaged unless suitable cooling is provided. Additionally, heating the collector optics 34 causes it to expand that changes the dimensions of the optics 34 affecting its optimal performance. Therefore, suitable design considerations must be provided to insure that the collector optics 34 is adequately cooled and configured so that the heating does not adversely affect performance of the source.

SUMMARY OF THE INVENTION

In accordance with the teachings of the present invention, a collector optic assembly for an EUV radiation source is disclosed. The collector optic assembly includes an elliptically shaped meniscus having a reflective Si/Mo coating for collecting and reflecting EUV radiation generated by the source. The meniscus is machined from a single piece of silicon. The collector optic assembly further includes a heat exchanger that includes cooling channels through which flows a liquid coolant. The heat exchanger is fabricated from a plurality of silicon sections fused together by a glass frit bonding process. The meniscus is fused to a front side of the heat exchanger by a glass frit bonding process. A liquid coolant inlet manifold and a liquid coolant outlet manifold are also each machined from a single silicon block and are mounted to a back side of the heat exchanger. Inlet coolant pipes are mounted to the inlet manifold, and outlet coolant pipes are mounted to the outlet manifold so that a liquid coolant can be introduced into the cooling channels through the inlet pipes and the inlet manifold and the warm coolant can be output from the heat exchanger through the outlet manifold and the outlet pipes.

Additional advantages and features of the present invention will become apparent from the following description and appended claims, taken in conjunction with the accompanying drawings.

DETAILED DESCRIPTION OF THE EMBODIMENTS

The following discussion of the embodiments of the invention directed to a collector optic for an EUV radiation source is merely exemplary in nature and is in no way intended to limit the invention or its applications or uses. For example, the collector optic discussed herein has particular application for an EUV radiation source. However, as will be appreciated by those skilled in the art, the collector optic and its design may have application for other systems and light sources.

Figure 1:
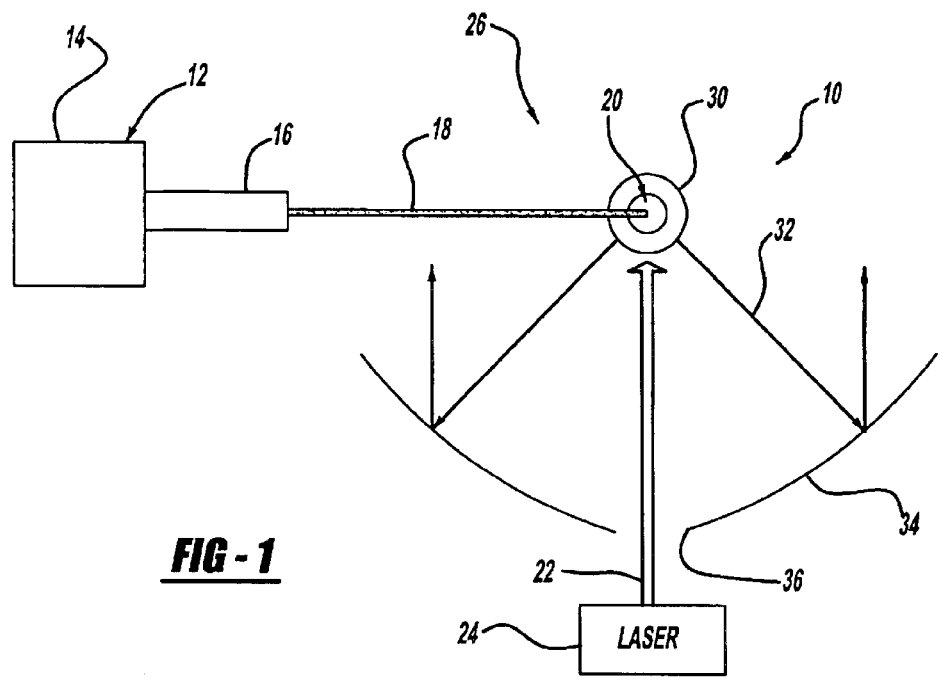
FIG. 1 is a plan view of an EUV radiation source.
Figure 2:
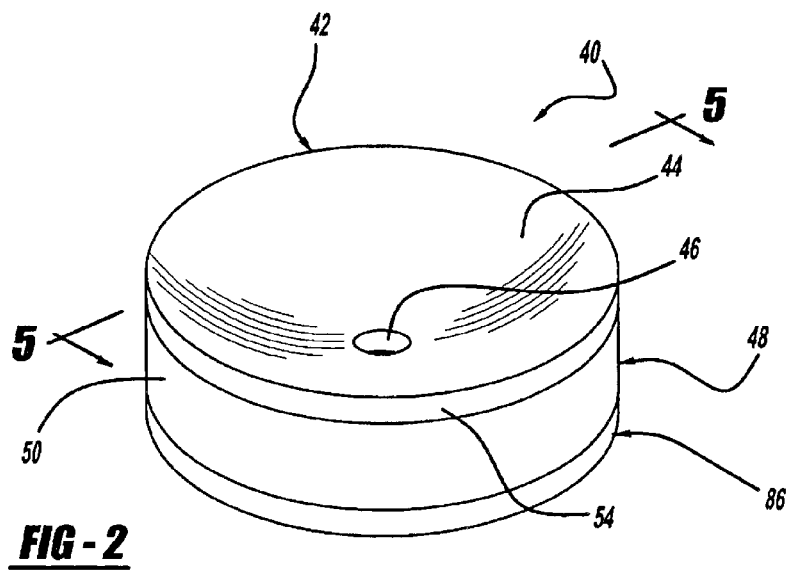
FIG. 2 is a front perspective view of a collector optic assembly for the EUV source shown in FIG. 1.
Figure 3:
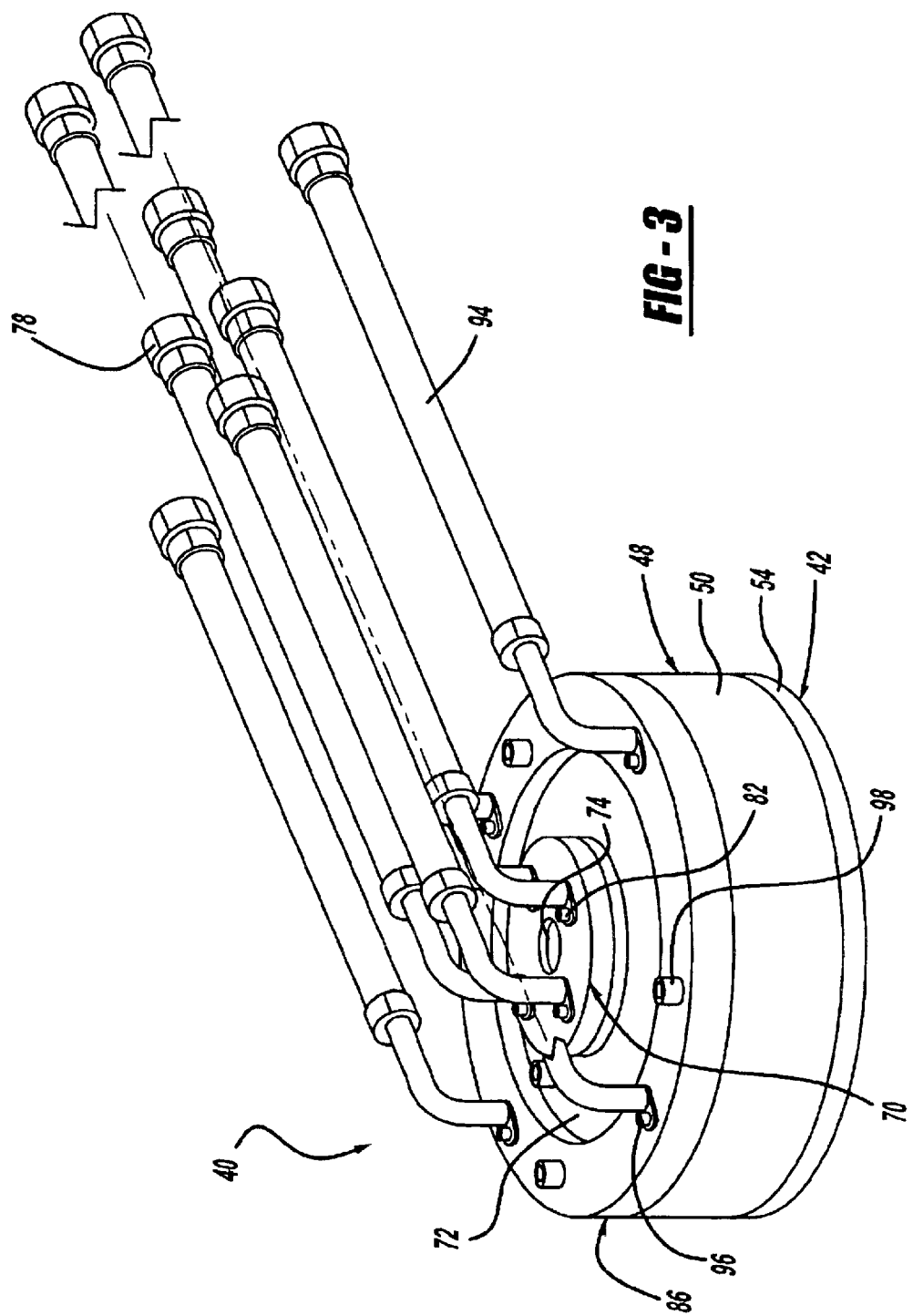
FIG. 3 is a back perspective view of the collector optic assembly shown in FIG. 2.
Figure 4:
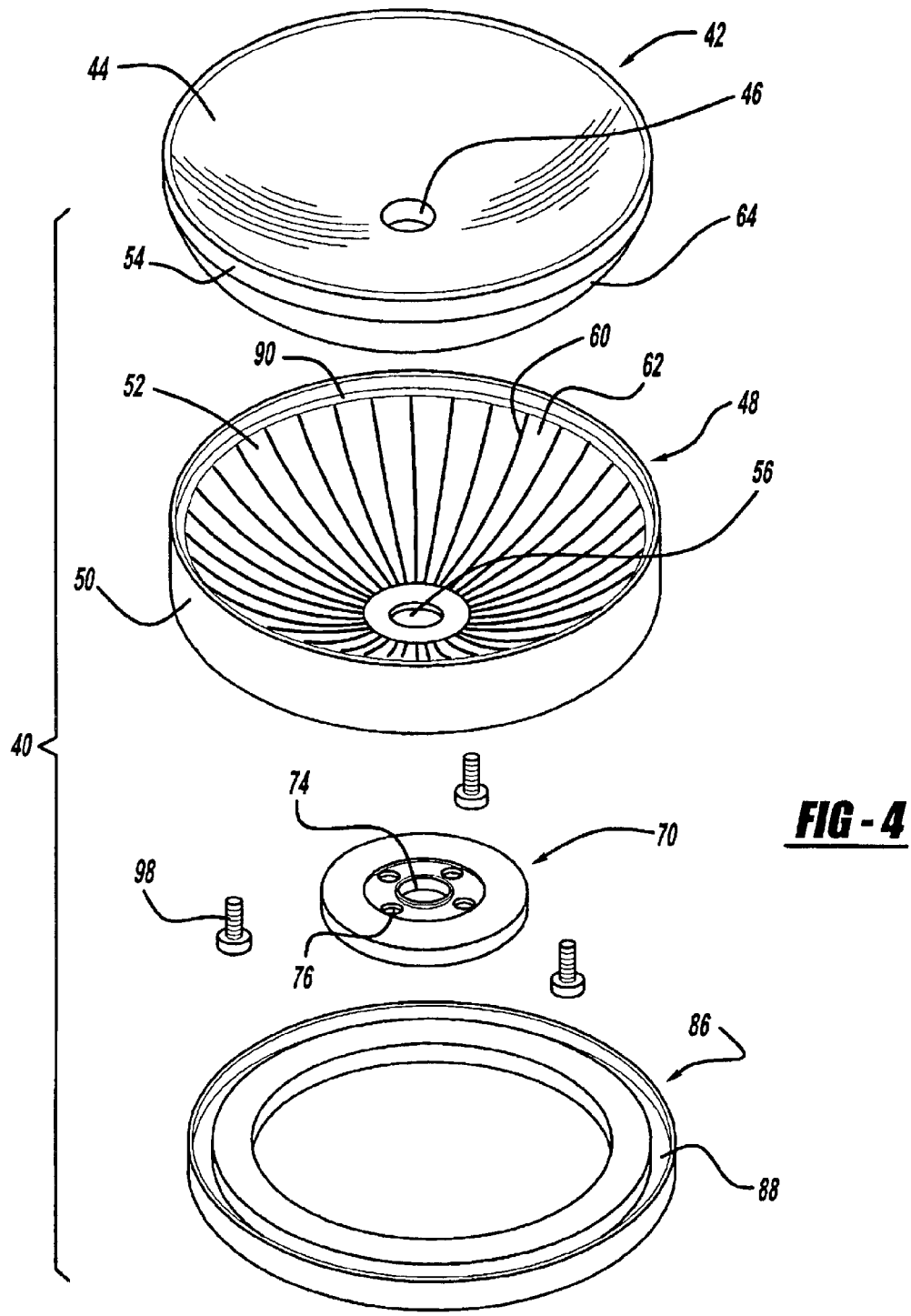
FIG. 4 is an exploded view of the collector optic assembly shown in FIG. 2.
Figure 5:
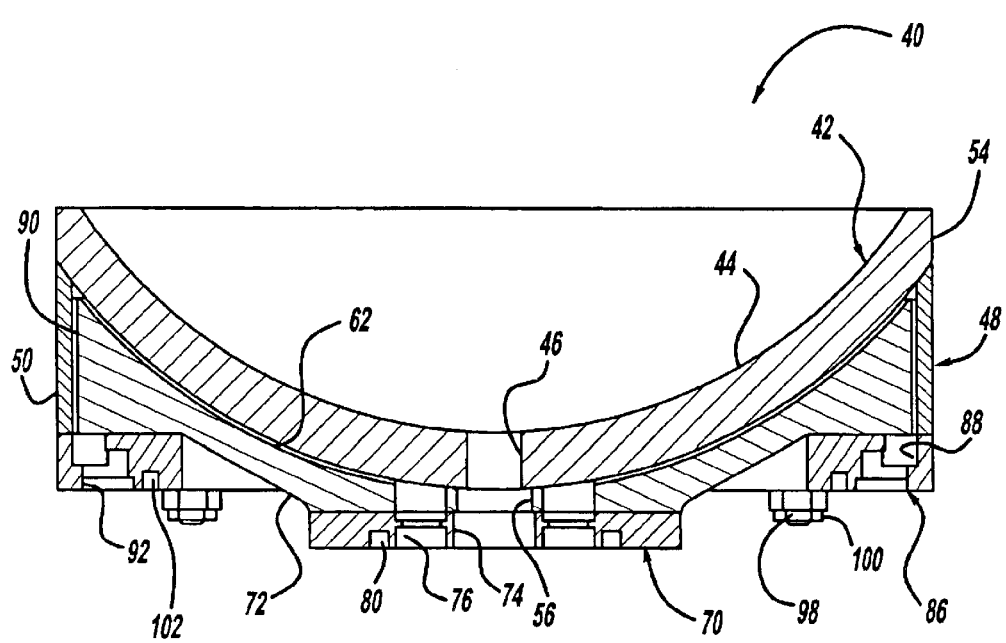
FIG. 5 is a cross-sectional view of the collector optic assembly through line 5-5 in FIG. 2.

FIG. 2 is a front perspective view, FIG. 3 is a back perspective view, FIG. 4 is an exploded view and FIG. 5 is a cross-sectional view of a collector optic assembly 40 that can be used as the collector optics 34 in the source 10 discussed above. The collector optic assembly 40 includes a meniscus 42 that has an elliptical dish shape, and has an outer reflective coating layer 44. In one embodiment, the layer 44 is a Si/Mo multilayer, however, other suitable reflective coatings may be used. According to the invention, the meniscus 42 is machined from a single piece of silicon so as to have a high thermal conductivity and be able to be polished to a very smooth surface suitable for the coating layer 44.

The meniscus 42 includes a side wall 54 and a center opening 46 through which the layer beam 22 propagates. The size and shape of the meniscus 42 is designed for the desired optimum collector optic performance. Particularly, the design of the meniscus 42 provides for the desired radiation collection efficiency, minimizes the variations in angle of incidence for increased reflective coating performance, maximizes the angle at the far focal point of the ellipse so that as much of the EUV radiation 32 as possible enters the aperture of the photolithography device (not shown), and has a proper reflective coating lifetime. These design criteria determine the shape of the ellipse based on its semi-major axis and it's eccentricity. By meeting all of these performance criteria, the design of the ellipse of the meniscus 42 can be identified.

The selection of the eccentricity E for the meniscus 42 that minimizes the high angles of incidence of the EUV radiation 32 on the meniscus 42 can use the following equation, where m is defined by the equation modeling the angular intensity distribution $I = \cos^m \theta$ with $\theta = 0$ being defined by the laser beam direction.

$$E_{opt,n} = 0.7432 - 0.0158 \, m \qquad (1)$$

If the temperature of the coating layer 44 gets too hot, the multilayers of the coating layer 44 diffuse into each other, and the reflectivity of the layer 44 is compromised. Further, significant heating of the meniscus 42 causes its shape to deform. According to the invention, the collector optic assembly 40 includes a design for active cooling to prevent damage of the coating layer 44 and distortion of the elliptical properties of the meniscus 42. Particularly, the collector optic assembly 40 includes a heat exchanger 48 having a sidewall 50 and an elliptical shaped base plate 52. The base plate 52 includes a center hole 56 that aligns with the center hole 46 in the meniscus 42 through which the laser beam 22 propagates. The heat exchanger 48 is formed of a plurality of machined silicon sections so that it is made of the same material as the meniscus 42, and thus has the same coefficient of thermal expansion (CTE). The base plate 52 includes radial ridges 60 that define cooling channels 62 therebetween. A bottom surface 64 of the meniscus 42 is positioned on the ridges 60 so that the openings 56 and 46 are aligned.

According to the invention, a glass frit bonding process is employed that uses a suitable glass frit and a heat and pressurization process within a suitable chamber to bond the assembly 40. Each of the separate sections of the base plate 52 defined by the channels 62 are fused together by the frit bonding process. The meniscus 42 is fused to the heat exchanger 48 by the bonding process where the bottom surface 64 of the meniscus is fused to the ridges 60. Additionally, the side wall 54 of the meniscus 42 is aligned with the side wall 50 of the heat exchanger 48. When the meniscus 42 is bonded to the heat exchanger 48, the channels 62 are sealed therein.

The collector optic assembly 40 also includes an inlet manifold 70 that is machined from a single block of silicon and is fused to a back surface 72 of the heat exchanger 48 by the frit bonding process. The inlet manifold 70 includes a center opening 74 that is aligned with the openings 56 and 46 when the inlet manifold 70 is fused to the heat exchanger 48. The inlet manifold 70 includes four coolant channels 76 that are in fluid communication with the channels 62. Four inlet pipes 78 (only shown in FIG. 3) are mounted to the inlet manifold 70 relative to the respective channels 76. The pipes 78 are mounted to the inlet manifold 70 by suitable fasteners 82 that are threaded into inserts 80 to provide proper sealing. The inserts 80 are made of metal and are also frit bonded to the inlet manifold 70.

The collector optics assembly 40 also includes an outlet manifold 86 that is fabricated from a single piece of silicon as a ring element. The outlet manifold 86 is mounted to an outer circumference of the back surface 72 of the heat exchanger 48, as shown. The outlet manifold 86 includes a ring channel 88 that is in fluid communication with an annular channel 90 in the heat exchanger 48. The channel 90 is also in fluid communication with each of the channels 62. The outlet manifold 86 also includes four coolant channels 92 that are in fluid communication with the ring channel 88, and receive four outlet pipes 94 (only shown in FIG. 3). The pipes 94 are mounted to the outlet manifold by suitable fasteners 96 that are threaded into inserts 102 to provide proper alignment. The inserts 102 are also made of metal and are frit bonded to the outlet manifold 86. A series of bolts 98 secure the outlet manifold 86 to the heat exchanger 48 through appropriate inserts 100.

A suitable cooling fluid, such as water, is introduced into the inlet pipes 78 from a suitable source (not shown). The cooling fluid flows through the inlet manifold 70, into the channels 62, and out of the outlet manifold 86 to be collected by the outlet pipes 94, where the cooling fluid is chilled and reused. Four inlet pipes 78 and four outlet pipes 94 are selected to provide the proper amount of coolant to the collector optics 40 at the desired flow rate, however, other numbers of inlet and outlet pipes can also be used.

The foregoing discussion discloses and describes merely exemplary embodiments of the present invention. One skilled in the art will readily recognize from such discussion, and from the accompanying drawings and claims, that various, changes, modifications and variations can be made therein without departing from the spirit and scope of the invention as defined in the following claims.

What is claimed is:

1. A collector optic assembly for collecting radiation, said assembly comprising:
    a heat exchanger fabricated from a plurality of sections fused together by a glass frit bonding process, said heat exchanger including a plurality of heat exchanger cooling channels;
    an elliptical meniscus machined from a single piece of silicon and being fused to the heat exchanger by a glass frit bonding process, said meniscus including a front reflective layer;
    an inlet manifold machined from a single piece of silicon and being fused to the heat exchanger by a glass frit bonding process, said inlet manifold including at least one inlet channel in fluid communication with the heat exchanger cooling channels; and
    an outlet manifold machined from a single piece of silicon and being mounted to the heat exchanger, said outlet manifold including at least one outlet channel in fluid communication with the heat exchanger cooling channels.

2. The assembly according to claim 1 wherein the inlet manifold includes four inlet openings for receiving four inlet pipes, and the outlet manifold includes four outlet openings for receiving four outlet pipes.

3. The assembly according to claim 1 wherein the inlet manifold is an annular member and the outlet manifold is a ring member.

4. The assembly according to claim 3 wherein the meniscus is fused to a front side of the heat exchanger and the inlet manifold and the outlet manifold are mounted to a back side of the heat exchanger, where the inlet manifold is fused to the back side of the heat exchanger within the outlet manifold.

5. The assembly according to claim 1 wherein the meniscus, the heat exchanger and the inlet manifold all include a center opening that are aligned.

6. The. assembly according to claim 1 wherein the outer reflective layer is a Si/Mo multilayer.

7. The assembly according to claim 1 wherein the collector optic assembly is part of an EUV radiation source and wherein the radiation is EUV radiation.

8. A collector optic assembly for collecting radiation, said assembly comprising:
    a silicon heat exchanger, said heat exchanger including at least one cooling channel; and
    an elliptical silicon meniscus, said meniscus having a front reflective layer and a back surface, said back surface being mounted to the heat exchanger.

9. The assembly according to claim 8 wherein the meniscus is fused to the heat exchanger by a glass frit bonding process.

10. The assembly according to claim 8 further comprising a silicon inlet manifold mounted to a back surface of the heat exchanger, said inlet manifold including at least one inlet channel in fluid communication with the at least one cooling channel.

11. The assembly according to claim 10 wherein the inlet manifold is fused to the back surface of the heat exchanger by a glass frit bonding process.

12. The assembly according to claim 10 wherein the meniscus, the heat exchanger and the inlet manifold all include a center opening that are aligned.

13. The assembly according to claim 8 further comprising a silicon outlet manifold mounted to a back surface of the heat exchanger, said outlet manifold including at least one outlet channel in fluid communication with the at least one cooling channel.

14. The assembly according to claim 8 wherein the reflective layer is a Si/Mo multilayer.

15. The assembly according to claim 8 wherein the collector optic assembly is part of an EUV radiation source and wherein the radiation is EUV radiation.

16. A method for assembling a collector optic for collecting radiation, said method comprising:
    fabricating a heat exchanger from one or more silicon pieces so that the heat exchanger includes at least one heat exchanger cooling channel;
    machining an elliptical meniscus from a single piece of silicon so that the meniscus has a front surface and a back surface;
    depositing a reflective outer layer on the front surface of the meniscus; and
    fusing the back surface of the meniscus to the heat exchanger by a glass frit bonding process.

17. The method according to claim 16 further comprising machining an inlet manifold from a single piece of silicon so that the inlet manifold includes at least one inlet channel and fusing the inlet manifold to a back surface of the heat exchanger by a glass frit bonding process so that the inlet channel is in fluid communication with the heat exchanger cooling channel.

18. The method according to claim 16 further comprising machining an outlet manifold from a single piece of silicon so that the outlet manifold includes at least one outlet channel and mounting the outlet manifold to the heat exchanger so that the outlet channel is in fluid communication with the heat exchanger cooling channel.

19. The method according to claim 16 wherein depositing a reflective outer layer on the front surface of the meniscus includes depositing a Si/Mo multilayer.

20. The method according to claim 16 wherein fabricating the heat exchanger and machining the meniscus includes machining a center opening in the heat exchanger and a center opening in the meniscus that are aligned when the meniscus is fused to the heat exchanger.

* * * * *